United States Patent
Sasho

(10) Patent No.: US 9,432,609 B2
(45) Date of Patent: *Aug. 30, 2016

(54) SIGNAL PROCESSING DEVICE AND SIGNAL PROCESSING METHOD

(71) Applicant: Sony Corporation, Tokyo (JP)

(72) Inventor: Noboru Sasho, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/550,105

(22) Filed: Nov. 21, 2014

(65) Prior Publication Data

US 2015/0131007 A1    May 14, 2015

Related U.S. Application Data

(63) Continuation of application No. 12/662,638, filed on Apr. 27, 2010, now Pat. No. 8,896,760.

(30) Foreign Application Priority Data

May 28, 2009    (JP) .................................. 2009-128702

(51) Int. Cl.
*H04N 5/44* (2011.01)
*H04N 5/50* (2006.01)
(Continued)

(52) U.S. Cl.
CPC ............... *H04N 5/50* (2013.01); *H03J 1/0008* (2013.01); *H03J 5/244* (2013.01); *H04N 21/4263* (2013.01)

(58) Field of Classification Search
CPC ..... H04N 5/50; H04N 21/4263; H03J 5/244; H03J 1/0008
USPC ........................................................ 348/725
See application file for complete search history.

(56) References Cited

U.S. PATENT DOCUMENTS 4,247,953 A * 1/1981 Shinagawa ............. H03J 5/244
                                                        334/15
4,633,101 A   12/1986 Masuda et al.
(Continued)

FOREIGN PATENT DOCUMENTS

EP    1 959 574 A2    8/2008
JP    04-241511 B2    8/1992
(Continued)

OTHER PUBLICATIONS

Extended European Search Report issued Jul. 22, 2010 for corresponding European Application No. 10 00 5135.
(Continued)

*Primary Examiner* — Michael Lee
(74) *Attorney, Agent, or Firm* — Michael Best & Friedrich LLP

(57) ABSTRACT

A signal processing device and signal processing method. A plurality of tuner circuits includes at least one that selectively provides a signal from among a plurality of signal bands potentially in an input signal in response to a control signal having a transition between a first state and a second state. A correction circuit corresponds to at least one of the plurality of tuner circuits, and is configured to receive the control signal and provide a corrected control signal for the tuner circuit. The corrected control signal has a gradual transition between the first state and the second state as compared to the transition between the first state and the second state in the control signal.

20 Claims, 12 Drawing Sheets

(51) Int. Cl.
  *H03J 1/00* (2006.01)
  *H03J 5/24* (2006.01)
  *H04N 21/426* (2011.01)

(56) References Cited

U.S. PATENT DOCUMENTS

| | | | |
|---|---|---|---|
| 4,641,190 | A | 2/1987 | Testin et al. |
| 2005/0253663 | A1 | 11/2005 | Gomez et al. |
| 2008/0178227 | A1 | 7/2008 | Petrovic et al. |
| 2009/0219449 | A1 | 9/2009 | Van Sinderen et al. |

FOREIGN PATENT DOCUMENTS

| | | |
|---|---|---|
| JP | 07-107014 | 4/1995 |
| JP | 09-139601 | 5/1997 |
| JP | 10-284901 | 10/1998 |
| JP | 2006-197446 A | 7/2006 |
| JP | 2007-143031 A | 6/2007 |
| JP | 2009-505601 A | 2/2009 |

OTHER PUBLICATIONS

Anonymous, "AMMC-2008 Application and Switching Characteristics" Avago Technologies, XP-002590802, May 22, 2008, pp. 1 to 6, URL: http://www.avagotech.com.docs/AV02-129 2EN.

Anonymous: "The 12C-Bus Specification Version 2.1" Phillips Semiconductors, XP002590803, Feb. 1, 2000, pp. 3 and 41 URL: http://www.nxp.com/arobat_download2/1iterature/9398/39340011.pdf.

Japanese Office Action issued Feb. 21, 2013 for corresponding Japanese Application 2009-128702.

European Patent Office Communication Pursuant to Article 94 (3)issue Jun. 5, 2014 for corresponding European Applciation No. 10 005 135.8.

\* cited by examiner

FIG.5
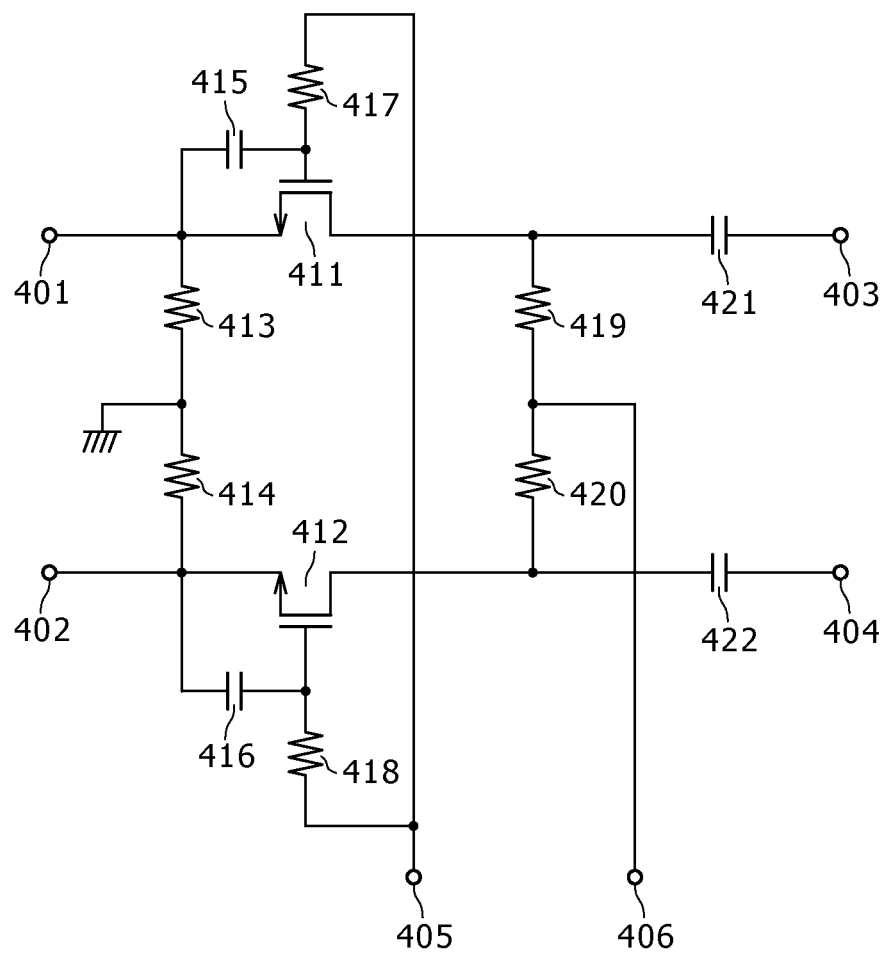
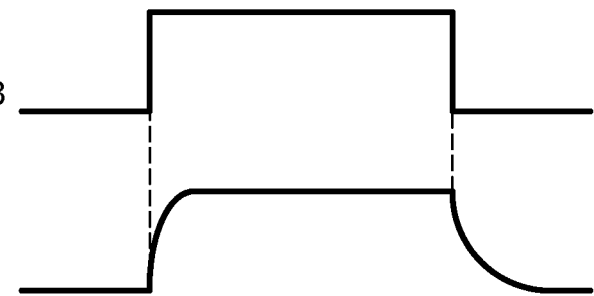
FIG.6A
SW1,SW2 OR SW3
FIG.6B

SIGNAL PROCESSING DEVICE AND SIGNAL PROCESSING METHOD

CROSS REFERENCE TO RELATED APPLICATIONS

The present application is a Continuation of U.S. application Ser. No. 12/662,638, filed on Apr. 27, 2010, and contains subject matter related to that disclosed in Japanese Priority Patent Application JP 2009-128702 filed in the Japan Patent Office on May 28, 2009, the entire content of which is hereby incorporated by reference.

BACKGROUND OF THE INVENTION

1. Field of the Invention

The present invention relates to for example a switch changing controlling method in a front-end circuit of a tuner that divides a wide-band television broadcast signal into a plurality of frequency bands and which can perform processing for each divided frequency band by changing and selecting a frequency band to be processed by one or a plurality of switches, and a signal processing device and a front-end circuit to which the switch changing controlling method is applied.

2. Description of the Related Art

The front-end circuit of a tuner for receiving television broadcasts can receive and process television broadcasts in various countries irrespective of broadcasting formats of the television broadcasts. However, when television broadcasts in various countries are received and used, the reception frequency band of the television broadcasts is very wide. Thus, it is generally difficult to select a received signal by one band-pass filter.

Accordingly, a front-end circuit is provided which changes a reception band according to a channel selecting operation of a user with frequencies used by television broadcasts in various countries divided into three bands as follows, for example.

(A) 46 to 147 MHz (VL band)
(B) 147 to 401 MHz (VH band)
(C) 401 to 887 MHz (U band)

FIG. 13 is a diagram showing an example of configuration of a part of a television broadcast receiver including an example of configuration of an input stage of the front-end circuit of a television tuner when the frequency band is thus divided into three bands. The front-end circuit 1 enclosed by a dotted line in the example of FIG. 13 is integrated into a one-chip IC (Integrated Circuit).

In FIG. 13, a television broadcast signal Vi received by an antenna is input to the input terminal 10 of the front-end circuit 1. The television broadcast signal Vi is supplied to band-pass filters 12A, 12B, and 12C for the three bands described above via three respective signal switches 11A, 11B, and 11C, which are turned on and off in correspondence with each of the above-described three bands. In this case, the band-pass filters 12A, 12B, and 12C have the respective frequency bands of the VL band, the VH band, and the U band described above as selected frequency bands.

A high-frequency switch using a semiconductor is used as the signal switches 11A, 11B, and 11C. High-frequency switches of this kind have recently been used with a very high frequency, and are also disclosed in Japanese Patent Laid-Open No. Hei 9-139601 (hereinafter referred to as Patent Document 1) and Japanese Patent Laid-Open No. Hei 10-284901 (hereinafter referred to as Patent Document 2), for example.

The output signals of the respective band-pass filters 12A, 12B, and 12C are supplied to respective mixers 14A, 14B, and 14C via respective low-noise amplifiers 13A, 13B, and 13C. The mixers 14A, 14B, and 14C are each supplied with a local oscillating signal. The mixers 14A, 14B, and 14C thereby frequency-convert the output signals of the respective low-noise amplifiers 13A, 13B, and 13C into lower intermediate frequencies. Then, the intermediate frequency signals from the mixers 14A, 14B, and 14C are supplied to a low-frequency processing section, so that television signals are demodulated.

In the example of FIG. 13, for example a system from the switch circuit 11A to the band-pass filter 12A to the low-noise amplifier 13A to the mixer 14A is for the VL band. A system from the switch circuit 11B to the band-pass filter 12B to the low-noise amplifier 13B to the mixer 14B is for the VH band. A system from the switch circuit 11C to the band-pass filter 12C to the low-noise amplifier 13C to the mixer 14C is for the U band.

Band changing signals SW1, SW2, and SW3 from a controlling section 2 formed by a microcomputer, for example, are supplied to the respective signal switches 11A, 11B, and 11C via respective terminal pins 15, 16, and 17.

The controlling section 2 is connected with a remote control receiving section 3. When receiving a remote control signal from a remote control transmitting section 4, the remote control receiving section 3 supplies the received signal to the controlling section 2. The controlling section 2 analyzes the received remote control signal, and performs a controlling process according to a result of the analysis.

In this case, when the remote control signal from the remote control transmitting section 4 is a channel selecting signal based on a channel changing operation by a user, the controlling section 2 first determines whether a channel indicated by the channel selecting signal is included in the VL band, the VH band, or the U band.

When the determined band is a band selected now, the controlling section 2 does not change the band changing signals SW1, SW2, and SW3 supplied to the switches 11A, 11B, and 11C. The controlling section 2 then changes and controls only the local oscillating signal supplied to the mixer in the system for the selected band so as to select the channel selected by the user.

When the determined band is different from the band selected now, the controlling section 2 selects and changes the switches 11A, 11B, and 11C by the band changing signals SW1, SW2, and SW3 so as to attain a state in which the band of the determination result is selected. The controlling section then changes and controls the local oscillating signal supplied to the mixer in the system for the band after the selection and change so as to select the channel selected by the user.

In this case, at the time of the channel change, a delay such as the pull-in time of a PLL circuit for generating the local oscillating signal and the like from the time of the change to a time at which a target broadcast channel is correctly received occurs.

The controlling section 2 therefore stops operation of a demodulating section in a stage succeeding the front-end circuit or mutes a signal supplied to the demodulating section for the period of the delay time from the time of a band change and the time of a channel change. Thereby a disturbance or the like of a reproduced image is prevented.

SUMMARY OF THE INVENTION

A signal processing device and signal processing method. By way of example, a plurality of tuner circuits includes at least one that selectively provides a signal from among a plurality of signal bands potentially in an input signal in response to a control signal having a transition between a first state and a second state. A correction circuit corresponds to at least one of the plurality of tuner circuits, and is configured to receive the control signal and provide a corrected control signal for the tuner circuit. The corrected control signal has a gradual transition between the first state and the second state as compared to the transition between the first state and the second state in the control signal.

BRIEF DESCRIPTION OF THE DRAWINGS

FIG. 5 is a diagram showing a circuit example of a signal switch used in the second embodiment of the present invention;

FIGS. 6A and 6B are diagrams of assistance in explaining operation of principal parts of the second embodiment of the present invention;

DETAILED DESCRIPTION OF PREFERRED EMBODIMENTS

Increasing numbers of recent television receivers include a plurality of tuners. This is to display program video of broadcast channels selected and received by each of the plurality of tuners with one screen divided into a plurality of pieces or to record a program on a different channel.

Figure 14:
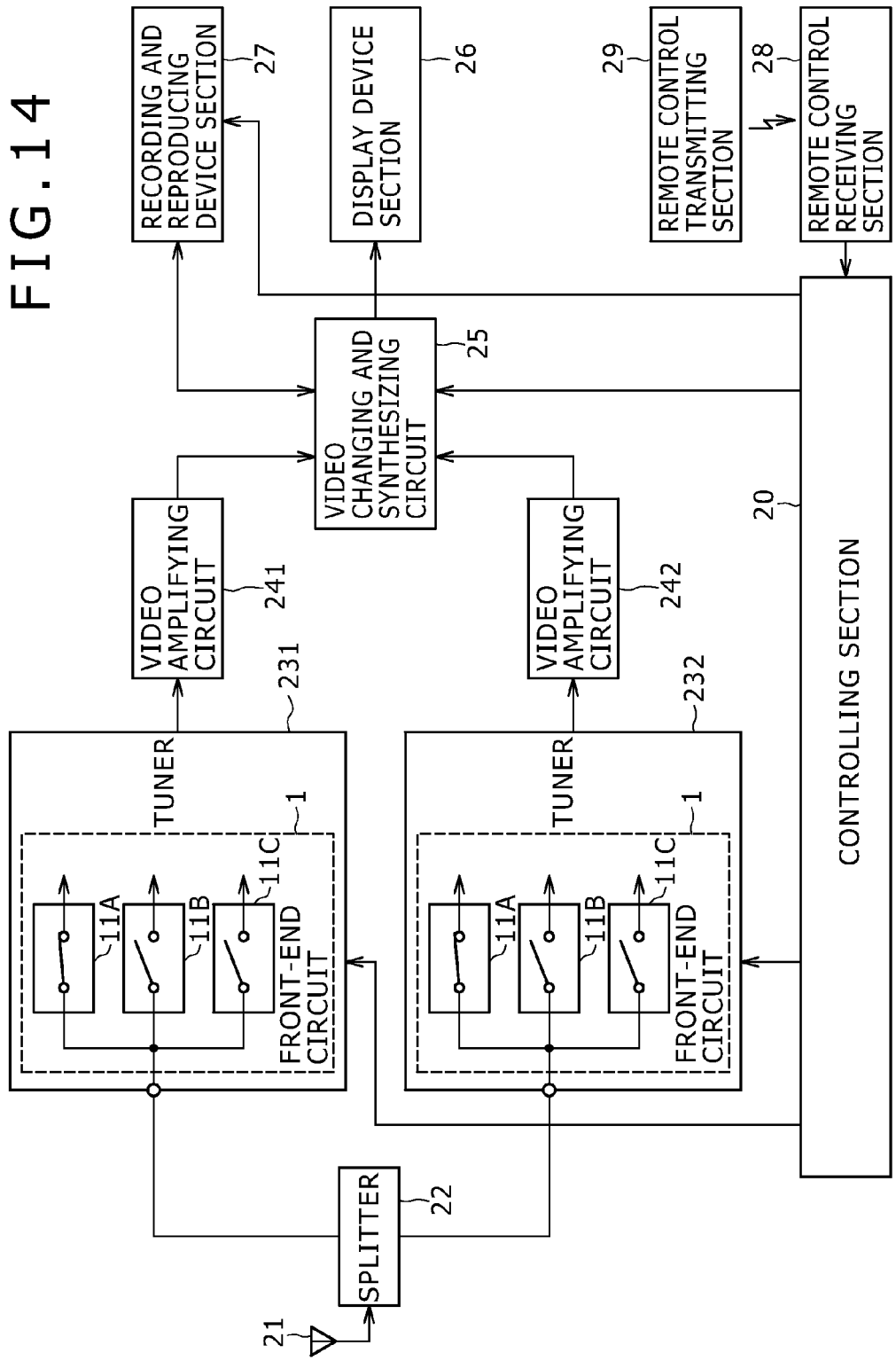
FIG. 14 is a diagram showing an ordinary example of configuration of a television receiver to which the embodiments of the present invention are applied.

FIG. 14 shows an example of configuration of a television receiver including two tuners. In this example, a television broadcast wave signal received by a receiving antenna 21 is distributed and supplied to a first tuner 231 and a second tuner 232 by a splitter 22 as signal distributing means.

The first tuner 231 and the second tuner 232 include a front-end circuit 1 configured to select three bands obtained by dividing a reception frequency band into three parts by signal switches 11A, 11B, and 11C, as described above with reference to FIG. 13.

The front-end circuits 1 of the first tuner 231 and the second tuner 232 each make a band change by independently receiving band changing signals SW1, SW2, and SW3 (not shown in FIG. 14) from a controlling section 20 formed by a microcomputer. In addition, the first tuner 231 and the second tuner 232 make a channel selection by controlling a local oscillating signal according to a channel selecting signal from the controlling section 20.

Figure 13:
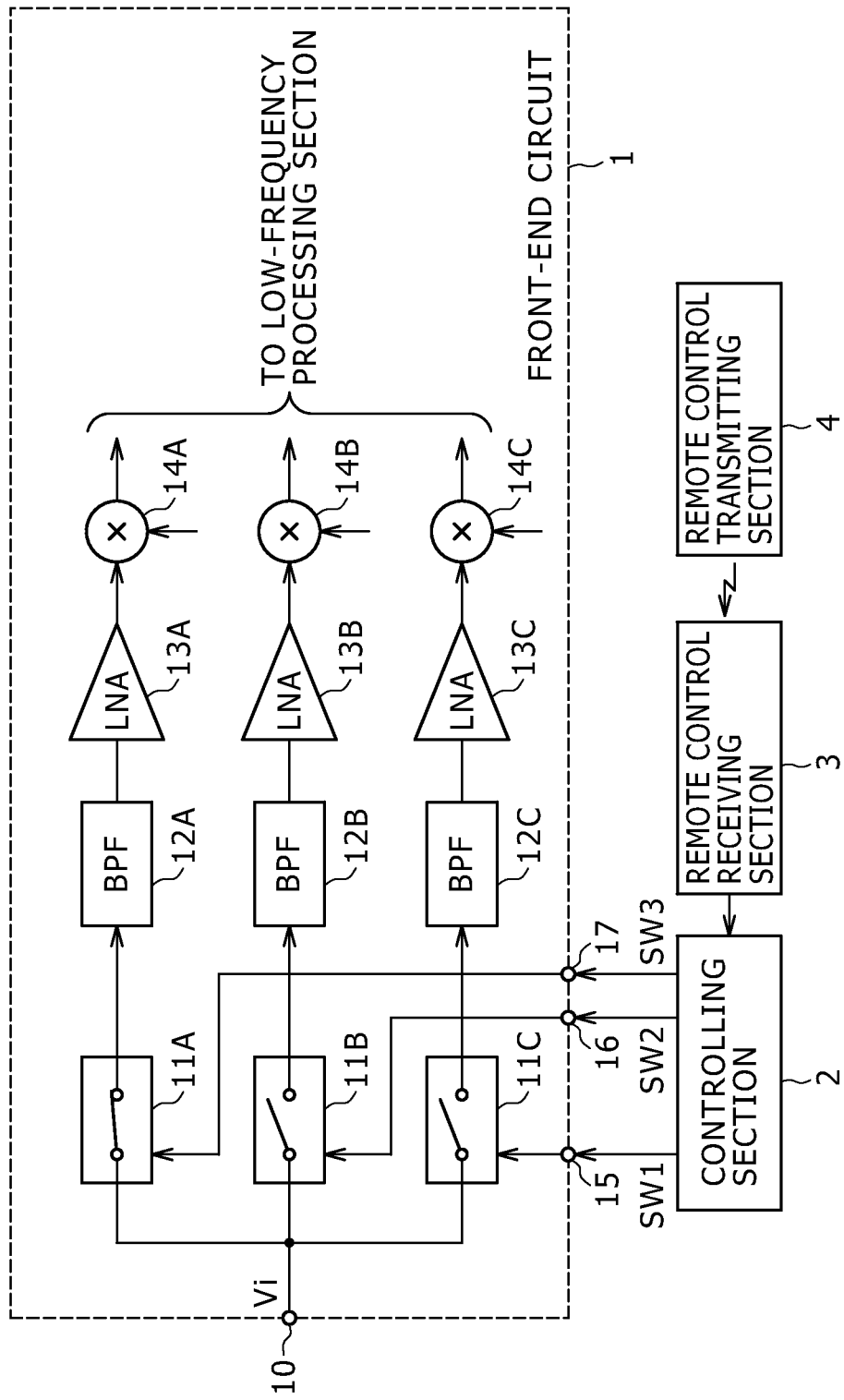
FIG. 13 is a diagram showing an ordinary example of configuration of a front-end circuit used in a television receiver to which the embodiments of the present invention are applied.

The controlling section 20 is connected with a remote control receiving section 28 for receiving a remote control signal from a remote control transmitting section 29 as in FIG. 13 described above. The controlling section 20 generates a control signal corresponding to an operation input for a channel change or an output mode change to be described later by a user on the remote control transmitting section 29. The controlling section 20 supplies the control signal to the tuners 231 and 232 and a video changing and synthesizing circuit 25 to be described later.

Each of the first tuner 231 and the second tuner 232 in this example converts a received signal obtained by selecting a channel according to the control signal from the controlling section 20 into an intermediate frequency signal, demodulates (detects) a video signal from the converted intermediate frequency signal, and outputs the video signal.

The video detection outputs from the first tuner 231 and the second tuner 232 are supplied to the video changing and synthesizing circuit 25 via video amplifying circuits 241 and 242, respectively. The video changing and synthesizing circuit 25 is supplied with a control signal corresponding to an instructing operation by the user from the controlling section 20.

The video changing and synthesizing circuit 25 supplies a video output signal to a display device section 26 and a recording and reproducing device section 27 in a plurality of output modes as described later according to the control signal supplied to the video changing and synthesizing circuit 25.

The display device section 26 includes for example a CRT (Cathode Ray Tube) or an LCD (Liquid Crystal Display) as a display element. The display device section 26 displays video corresponding to the video output signal.

The recording and reproducing device section 27 has a function of recording and reproducing a broadcast signal using a hard disk device, an optical disk driver using removable recording media such for example as a DVD (Digital Versatile Disk), and the like. The recording and reproducing device section 27 is supplied with a control signal for recording/reproduction from the controlling section 20.

The video changing and synthesizing circuit 25 in this example has a plurality of output modes corresponding to instructing operations by the user as follows.

(1) A first output mode in which the video output signal of one of the first tuner 231 and the second tuner 232 is selected, and supplied to one of the display device section 26 and the recording and reproducing device section 27.

(2) A second output mode in which the video output signal of one of the first tuner 231 and the second tuner 232 is output to the display device section 26, and the video output signal of the other is output to the recording and reproducing device section 27.

(3) A third output mode in which the video output signals of the first tuner 231 and the second tuner 232 are synthesized, and the synthesized video output signal is supplied to the display device section 26.

Incidentally, when the recording and reproducing device section 27 is changed to a reproducing mode by the control signal from the controlling section 20, the video changing and synthesizing circuit 25 is set in an output mode in which a reproduced video signal from the recording and reproducing device section 27 is supplied to the display device section 26 according to the control signal from the controlling section 20.

In the first mode described above, only one of the first tuner and the second tuner is in an operating state, and the tuner not in an operating state is generally set in a standby state to save power. In the first mode, when a channel selecting and changing operation is performed by the user, control for muting or stopping the operation of the demodulating section is performed as described above to prevent disturbance of video or noise at the time of the change.

However, in the second output mode and the third output mode, the first tuner 231 and the second tuner 232 are in an operating state at the same time, and make a channel change and selection independently of each other. Thus the following problems are found to be caused by a band change.

Consideration will be given to for example a case where a broadcast program of a channel selected by the second tuner 232 is recorded in the second output mode while the video of a broadcast program of a channel selected by the first tuner 231 is displayed on the display screen of the display device section 26.

In this case, when the user changes the channel selected by the first tuner 231 or the tuner 232, the channel change may involve a band change.

When the on/off states of the signal switches 11A, 11B, and 11C are changed by the band change, a signal frequency handled by the tuner that has made the band change is changed. Then, impedance for the signal frequency after the change changes at the time of changing the signal switches 11A, 11B, and 11C.

It has been found that when sufficient isolation is not provided for the splitter 22, the change in input impedance in the tuner that has made the band change may degrade a signal supplied to the other tuner via the splitter 22. This will be described together with possible reasons.

As described above, a high-frequency switch formed by a semiconductor is used as the signal switches 11A, 11B, and 11C for band change. With ordinary high-frequency switches in publicly known examples such as Patent Documents 1 and 2 or the like, a time from reception of the changing signals to a signal change, that is, the time of a transition of impedance of a signal path is often very short.

Figure 15A:
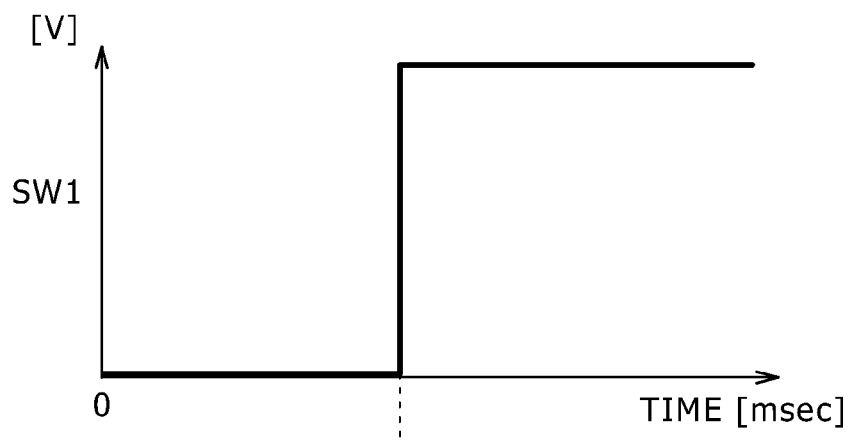
FIGS. 15A, 15B, and 15C are diagrams of assistance in explaining aims of the embodiments of the present invention.
Figure 15B:
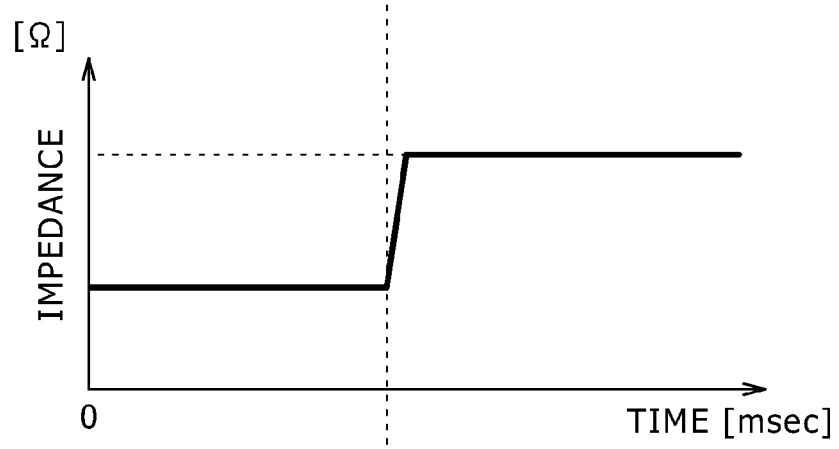

FIGS. 15A and 15B show a changing signal for a high-frequency switch and changes in input impedance of the tuner.

The example of FIGS. 15A and 15B assumes a case of changing from a state of the signal switch 11A or 11B being on to a state of the signal switch 11A being on. FIG. 15A shows the changing signal SW1 for the signal switch 11A.

FIG. 15B shows changes in input impedance at a frequency handled by a system including the signal switch 11A when a change is made from the on state of the signal switch 11B or the switch 11C to the on state of the signal switch 11A.

In this case, before the signal switch 11A is changed to the on state, the frequency band of the system including the signal switch 11B or 11C is outside the band of frequencies handled by the system including the signal switch 11A, and thus a low impedance is exhibited. After the signal switch 11A is changed to the on state, a high impedance is exhibited because resonance impedance for the frequency handled by the system including the signal switch 11A appears.

The changing control signal SW1 for the signal switch 11A is a stepwise signal, as shown in FIG. 15A. Thus, an impedance transition before and after the changing of the signal switch 11A to the on state is also a near-stepwise response waveform, as shown in FIG. 15B.

The two tuners 231 and 232 are connected to each other via the splitter 22. Thus, when sufficient isolation is not provided between the two output terminals of the splitter, a stepwise transition of input impedance of one tuner may momentarily degrade a signal supplied to the other tuner.

Figure 15C:
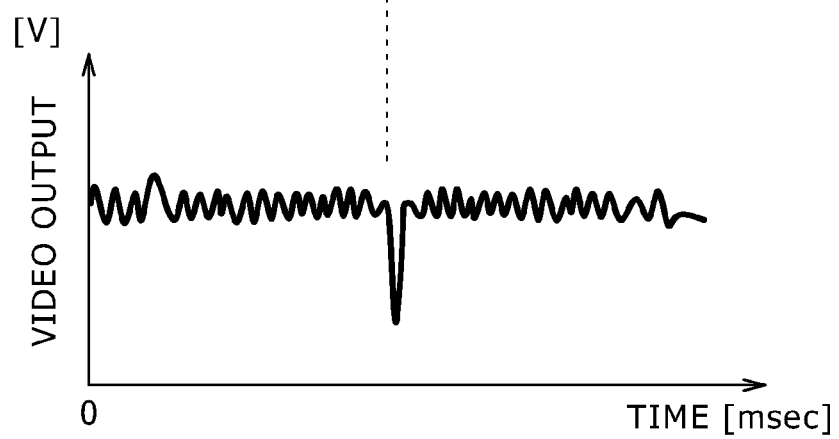

For example, in the case of an analog television broadcast signal, a spike noise as shown in FIG. 15C is superimposed on a video signal at the time of a band change. The spike noise appears as noise in the video on the display screen.

For example, when there is a band change at the time of changing a channel selected by the tuner 232 while the video of a broadcast program on a channel selected by the tuner 231 is being viewed on the display screen of the display device section 26, noise appears in the displayed video at the time of the band change.

In addition, for example, when there is a band change at the time of changing a channel selected by the tuner 231 while a broadcast program on a channel selected by the tuner 232 is being recorded by the recording and reproducing device section 27, noise is recorded in a state of being superimposed on a recording signal at the time of the band change.

The present invention has been made in view of the problems as described above. It is desirable to reduce degradation of a signal for a signal processing section due to the changing of a signal switch provided in another signal processing section when an input signal is distributed to the plurality of signal processing sections via a signal distributing section.

According to the embodiment of the present invention with the above-described constitution, when the one or the plurality of signal switches in the signal processing section are changed by the changing signal, the input impedance of the signal processing section in which the one or the plurality of signal switches are changed makes a non-steep transition. Thus, even when a good isolation is not provided for the signal distributing section, degradation of a signal supplied to another signal processing section connected to the signal distributing section is reduced.

According to the embodiments of the present invention, even when a good isolation is not provided for the signal distributing section, degradation of a signal supplied to another signal processing section connected to the signal distributing section at the time of changing the signal switches in one signal processing section is reduced.

A few embodiments of a signal processing device according to the present invention will hereinafter be described with reference to the drawings by taking as an example a case where the present invention is applied to the television receiver described above with reference to FIG. 14.

Embodiments of the present invention include a signal processing device and signal processing method.

For example, a plurality of tuner circuits includes at least one that selectively provides a signal from among a plurality of signal bands potentially in an input signal in response to a control signal having a transition between a first state and a second state. A correction circuit corresponds to at least one of the plurality of tuner circuits, and is configured to receive the control signal and provide a corrected control signal for the tuner circuit. The corrected control signal has a gradual transition between the first state and the second state as compared to the transition between the first state and the second state in the control signal.

According to one aspect of the present invention, the corrected control signal for the tuner circuit reduces a signal degradation occurring in another tuner circuit of the plurality of tuner circuits in response to the transition. Specifically, the corrected control signal may produce a reduced rate of impedance change in the tuner circuit to prevent a signal degradation occurring in another tuner circuit of the plurality of tuner circuits in response to the transition.

Figure 1:
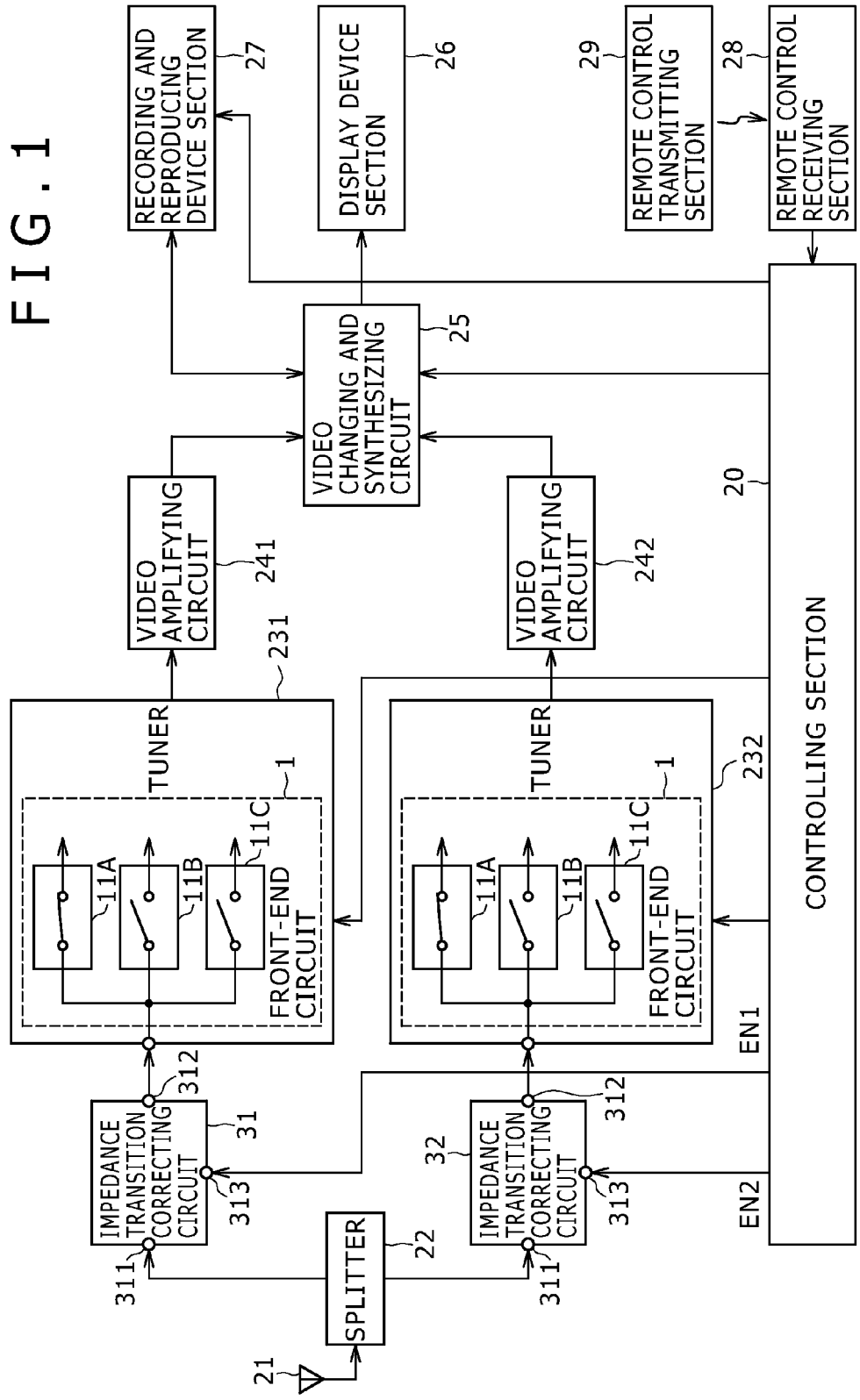
FIG. 1 is a block diagram showing an example of configuration of a television receiver as a first embodiment of a signal processing device according to the present invention.

FIG. 1 is a block diagram showing an example of configuration of a television receiver as a first embodiment of the signal processing device according to the present invention. The example of FIG. 1 is an application of the first embodiment of the present invention to the television receiver described above with reference to FIG. 14. In the example of FIG. 1, the same parts as in the example of FIG. 14 are identified by the same reference numerals, and description thereof will be omitted.

In the first embodiment of the present invention, impedance transition correcting circuits 31 and 32 are provided between a splitter 22 as a signal distributing section and a first and a second tuner 231 and 232 as an example of signal processing sections, respectively.

In this example, the impedance transition correcting circuits 31 and 32 are provided outside front-end circuits 1 integrated into an IC in the first and second tuners 231 and 232.

The impedance transition correcting circuits 31 and 32 are controlled by a first and a second control signal EN1 and EN2, respectively, from a controlling section 20 independently of each other.

Figure 2:
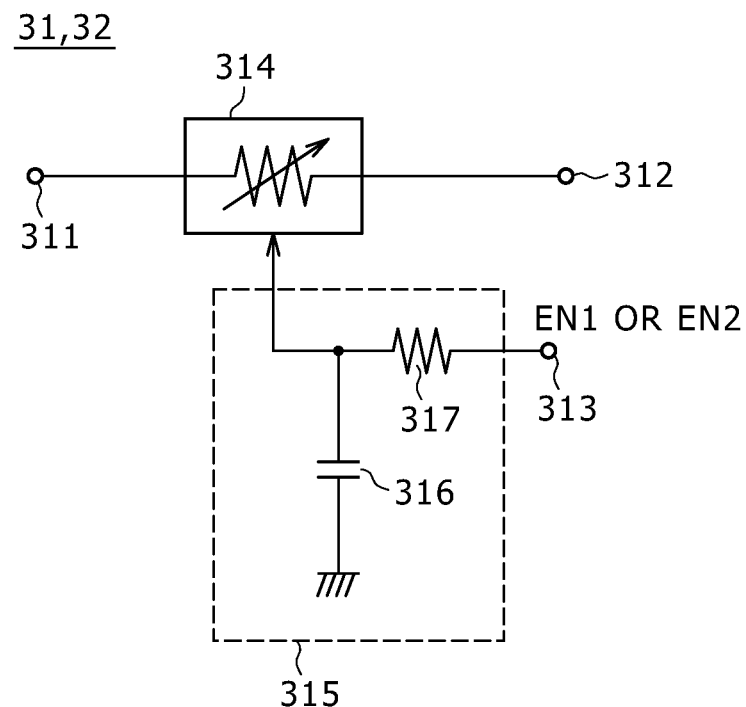
FIG. 2 is a diagram showing an example of configuration of a part of a circuit of the first embodiment of FIG. 1.

FIG. 2 shows an example of configuration of the impedance transition correcting circuit 31 or 32. The impedance transition correcting circuits 31 and 32 have a similar configuration except that the impedance transition correcting circuits 31 and 32 receive different control signals, that is, the first control signal EN1 and the second control signal EN2 from the controlling section 20.

Specifically, the impedance transition correcting circuit 31 or 32 has an input terminal 311 for receiving a signal from the splitter 22, an output terminal 312 for outputting an output signal to be supplied to the tuner 231, and a control terminal 313 for receiving the control signal EN1 or EN2 from the controlling section 20.

A variable resistive element 314 formed by a MOS (Metal Oxide Semiconductor) type field effect transistor (hereinafter referred to as a MOS transistor), for example, is connected between the input terminal 311 and the output terminal 312. The control signal EN1 or EN2 from the controlling section 20 via the control terminal 313 is supplied to the control terminal (for example the gate) of the variable resistive element 314 through a time constant circuit 315.

The time constant circuit 315 in this example is formed by a capacitor element 316 and a resistance 317. The control terminal of the variable resistive element 314 is connected to a grounding terminal via the capacitor element 316. A point of connection between the capacitor element 316 and the control terminal of the variable resistive element 314 is connected to the control terminal 313 via the resistance 317.

The variable resistive element 314 is set at a predetermined resistance value when no band change is made. For example, when the variable resistive element 314 is formed by a MOS transistor, the gate of the MOS transistor is supplied with a voltage EA as the control signal EN1 or EN2 such that drain-to-source conduction resistance has a predetermined resistance value (see FIG. 3).

When a band change is made in the first and second tuners in a stage succeeding the impedance transition correcting circuits 31 and 32, the variable resistive elements 314 of the impedance transition correcting circuits 31 and 32 are set in an off state (state of infinite impedance) by the control signals EN1 and EN2, respectively, prior to the band change. For example, when the variable resistive element 314 is formed by a MOS transistor, the control signal EN1 or EN2 supplied to the gate of the MOS transistor is set to a zero potential, so that the MOS transistor is set in an off state.

Figure 3:
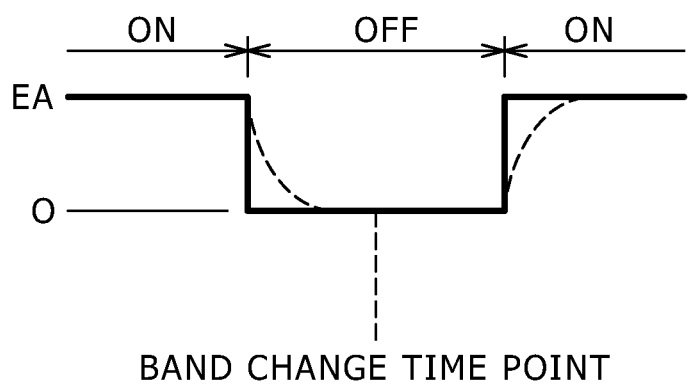
FIG. 3 is a diagram of assistance in explaining circuit operation of the first embodiment of FIG. 1.

At this time, however, while the control signal EN1 or EN2 changes stepwise as shown by a solid line in FIG. 3, the time constant circuit 315 makes the gate potential of the MOS transistor change continuously and gently rather than steeply, as shown by a broken line in FIG. 3.

After completion of the band change, the variable resistive elements 314 of the impedance transition correcting circuits 31 and 32 are controlled so as to be returned to the original state (on state) of the predetermined resistance value by the respective control signals EN1 and EN2.

As will be described later, the impedance transition correcting circuits 31 and 32 have a time constant circuit, and make a transition according to the time constant of the time constant circuit when an impedance transition switch makes a transition from an on state to an off state and when the impedance transition switch makes a transition from the off state to the on state.

Also at this time, while the control signal EN1 or EN2 changes stepwise as shown by the solid line in FIG. 3, the time constant circuit 315 makes the gate potential of the MOS transistor change continuously and gently rather than steeply, as shown by the broken line in FIG. 3. The broken line illustrates an example of a corrected control signal that has a gradual change between first and second states as compared to the original control signal EN1 or EN2.

That is, the time constant circuit 315 suppresses a stepwise steep change into a non-steep change.

When signal switches 11A, 11B, and 11C of the front-end circuit 1 within the second tuner 232 are changed while the first tuner 231 is operating, the impedance transition correcting circuit 32 is controlled by the control signal EN2 as shown in FIG. 3.

When signal switches 11A, 11B, and 11C of the front-end circuit 1 within the first tuner 231 are changed while the second tuner 232 is operating, the impedance transition correcting circuit 31 is controlled by the control signal EN1 as shown in FIG. 3.

Thus, an impedance transition at the time of a band change is a continuous and gentle change rather than a steep change. Thereby, a spike-shaped noise as described with reference to FIGS. 15A to 15C is prevented from being superimposed on a signal supplied to another tuner than a tuner that has made a band change, and signal degradation in the other tuner is reduced. That is, a band change can be made in the front-end circuit 1 of the tuner without an adverse effect of noise being produced on the other tuner in operation.

In the first embodiment, impedance transition correcting circuits are provided on the signal input side of the tuners 231 and 232. On the other hand, a second embodiment has a configuration that suppresses a stepwise steep change in a band changing switch and a changing signal supplied to the band changing switch into a non-steep change without correcting circuits such as the impedance transition correcting circuits or the like being provided in signal paths.

Figure 4:
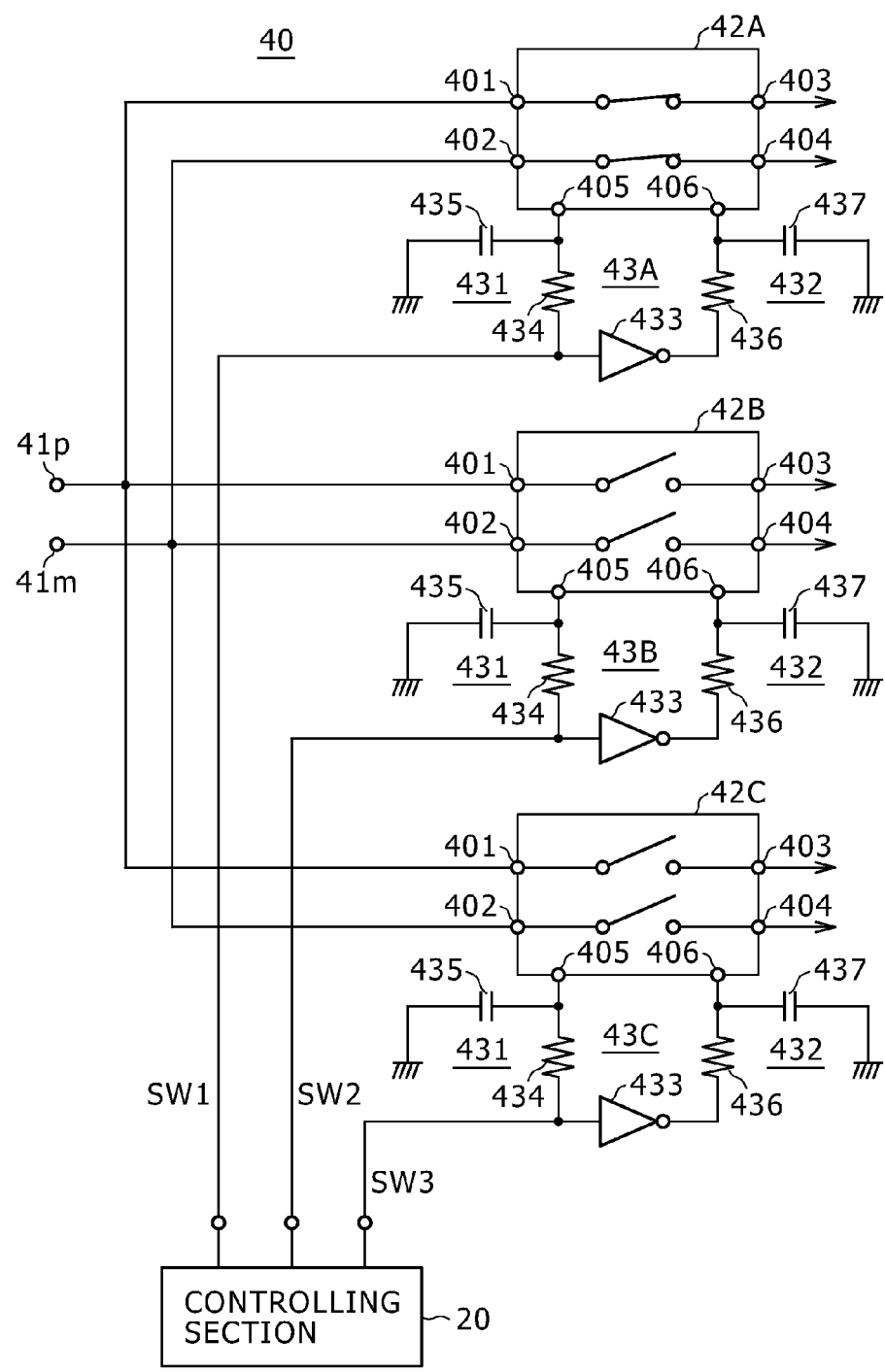
FIG. 4 is a circuit diagram showing another example of configuration of a principal part circuit of a second embodiment of the signal processing device according to the present invention.

FIG. 4 is a diagram showing an example of configuration of the band changing switches of a front-end circuit according to the second embodiment and a control circuit 40 for controlling changing signals for the band changing switches. The circuit 40 of FIG. 4 represents a part of the front-end circuit formed into a one-chip IC excluding a controlling section 20.

A signal in the example of FIG. 4 is of a balanced type (differential type). The positive side input terminal 41p and the negative side input terminal 41m of the front-end circuit are supplied with a positive side input signal Vip and a negative side input signal Vim from a splitter 22.

The positive side input signal Vip and the negative side input signal Vim input through the positive side input terminal 41p and the negative side input terminal 41m are supplied to each of signal switches 42A, 42B, and 42C.

The signal switch 42A is a signal switch for a band VL. The signal switch 42B is a signal switch for a band VH. The signal switch 42C is a signal switch for a band U. The controlling section 20 supplies a band changing signal SW1 to the signal switch 42A, a band changing signal SW2 to the signal switch 42B, and a band changing signal SW3 to the signal switch 42C via changing signal correcting circuits 43A, 43B, and 43C, respectively.

The signal switches 42A, 42B, and 42C have exactly the same configuration. FIG. 5 shows an example of configuration of one of the signal switches 42A, 42B, and 42C.

A positive side input terminal 401 is connected to the source of an n-type MOS transistor 411, which is a semiconductor switch. A negative side input terminal 402 is connected to the source of an n-type MOS transistor 411, which is a semiconductor switch.

In addition, a series circuit of resistances 413 and 414 is connected between the positive side input terminal 401 and the negative side input terminal 402. A middle point of connection between the resistances 413 and 414 is grounded.

A capacitor element 415 is connected between the source and gate of the MOS transistor 411. A capacitor element 416 is connected between the source and gate of the transistor 412. The gate of the MOS transistor 411 is connected to a gate controlling terminal 405 via a resistance 417. The gate of the MOS transistor 412 is connected to the gate controlling terminal 405 via a resistance 418.

A series circuit of resistances 419 and 420 is connected between the drain of the MOS transistor 411 and the drain of the MOS transistor 412. A middle point of connection between the resistances 413 and 414 is connected to a drain controlling terminal 406.

The drain of the MOS transistor 411 is connected to a positive side output terminal 403 via a capacitor element 421. The drain of the MOS transistor 412 is connected to a negative side output terminal 404 via a capacitor element 422.

The resistances 413, 414, 417, 418, 419, and 420 all have a sufficiently large value with respect to signal source impedance, and preferably have a value of 10 kΩ) or more.

In the example of FIG. 5, as described above, the direct-current potential of the sources of the MOS transistors 411 and 412 is fixed at a ground potential (0 V) at all times.

As shown in FIG. 4, the band changing signal SW1, SW2, or SW3 is supplied to the gate controlling terminal 405 and the drain controlling terminal 406 via the changing signal correcting circuit 43A, 43B, or 43C.

The changing signal correcting circuits 43A, 43B, and 43C have a same configuration. The changing signal correcting circuits 43A, 43B, and 43C each include time constant circuits 431 and 432, and include an inverter 433. The time constant circuit 431 is composed of a resistance 434 and a capacitor element 435. The time constant circuit 432 is composed of a resistance 436 and a capacitor element 437.

The band changing signal SW1, SW2, or SW3 is supplied to the gate controlling terminal 405 via the time constant circuit 431. In addition, the band changing signal SW1, SW2, or SW3 is subjected to polarity determination by the inverter 433, and is thereafter supplied to the drain controlling terminal 406 via the time constant circuit 432.

That is, the gate controlling terminal 405 and the drain controlling terminal 406 of the signal switches 42A, 42B, and 42C are complementarily supplied with a controlling potential to perform switching control of the signal switches 42A, 42B, and 42C.

When the MOS transistors 411 and 412 as semiconductor switches are turned on, the band changing signal SW1, SW2, or SW3 that sets the gate controlling terminal 405 to a high level and sets the drain controlling terminal 406 to a low level is supplied. When the MOS transistors 411 and 412 are turned off, the band changing signal SW1, SW2, or SW3 that conversely sets the gate controlling terminal 405 to a low level and sets the drain controlling terminal 406 to a high level is supplied.

In the above second embodiment, the band changing signal SW1, SW2, or SW3 is respectively supplied to the signal switch 42A, 42B, or 42C via the changing signal correcting circuit 43A, 43B, or 43C including the time constant circuits 431 and 432.

Thus, the stepwise band changing signal SW1, SW2, or SW3 as shown in FIG. 6A is converted into a signal that changes continuously and gently rather than changing steeply by the time constant circuits 431 and 432, and then supplied to the signal switch 42A, 42B, or 42C, respectively. The corrected band changing signal as shown in FIG. 6B illustrates an example of a corrected control signal that has a gradual change between first and second states as compared to the original control signal SW1, SW2, or SW3 of FIG. 6A.

Therefore, a spike-shaped noise as described with reference to FIGS. 15A to 15C is prevented from being superimposed on a signal supplied to another tuner than a tuner that has made a band change, and signal degradation in the other tuner is reduced.

Incidentally, in order to control the turning on and off of the signal switches 42A, 42B, and 42C, it suffices to supply the band changing signals SW1, SW2, and SW3 to the gate controlling terminals 405 via the changing signal correcting circuits 43A, 43B, and 43C.

However, when control is performed such that the drain controlling terminal 406 makes a complementary potential change with respect to the gate controlling terminal 405 as in the present embodiment, excellent distortion characteristics of the signal switches 42A, 42B, and 42C as analog switches can be obtained.

A third embodiment is an example of modification of the second embodiment. In the second embodiment, the band changing switches in the front-end circuits and the control circuit 40 for the changing signals use the changing signal correcting circuits 43A, 43B, and 43C including time constant circuits.

The third embodiment has a changing signal correcting circuit using a charge pump circuit rather than a time constant circuit.

Figure 7:
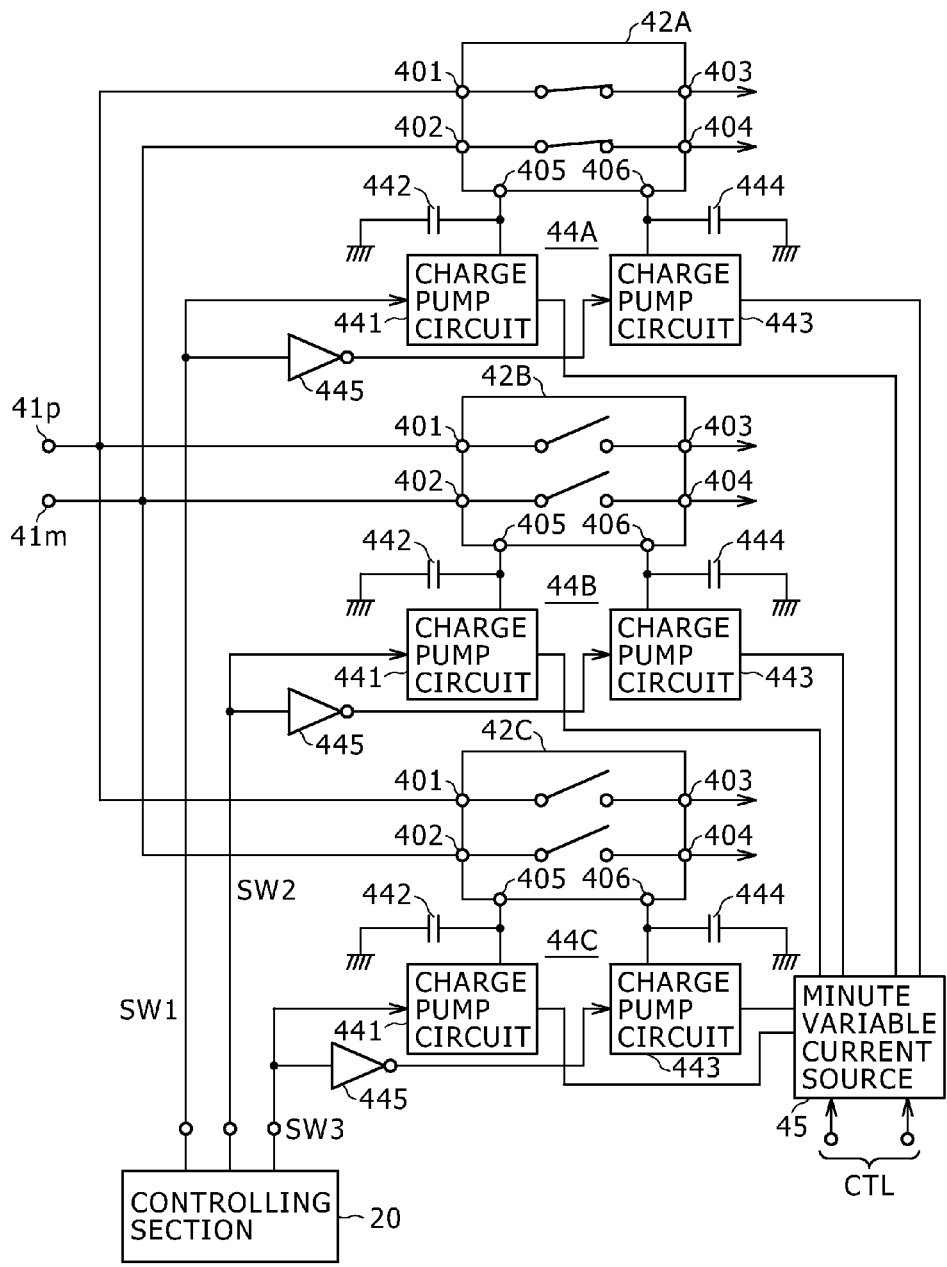
FIG. 7 is a circuit diagram showing another example of configuration of a principal part circuit of the embodiment of FIG. 1.

FIG. 7 is a diagram showing an example of configuration of the band changing switches of front-end circuits according to the third embodiment and a control circuit 40 for controlling changing signals for the band changing switches. The circuit 40 of FIG. 7 is also integrated into a one-chip IC excluding a controlling section 20, and terminals shown in FIG. 7 correspond to terminal pins of the IC.

In FIG. 7, the same parts as in the second embodiment of FIG. 4 are identified by the same reference numerals, and detailed description thereof will be omitted. Signal switches 42A, 42B, and 42C have the circuit configuration shown in FIG. 5.

In the third embodiment, changing signal correcting circuits 44A, 44B, and 44C are provided for the signal switches 42A, 42B, and 42C in place of the changing signal correcting circuits 43A, 43B, and 43C in the second embodiment. In the third embodiment, a minute current from a minute variable current source 45 is supplied to each of the changing signal correcting circuits 44A, 44B, and 44C. Other configurations are similar to those of the second embodiment.

The changing signal correcting circuits 44A, 44B, and 44C each have an identical circuit configuration. The changing signal correcting circuits 44A, 44B, and 44C are each composed of a charge pump circuit 441 and a capacitor element 442, a charge pump circuit 443 and a capacitor element 444, and an inverter 445. The minute current from a minute variable current source 45 is supplied to each of the charge pump circuit 443 and the capacitor element 444.

Band changing signals SW1, SW2, and SW3 are supplied to the gate controlling terminal 405 and the drain controlling terminal 406 of each of the signal switches 42A, 42B, and 42C via the changing signal correcting circuits 44A, 44B, and 44C, respectively.

In the changing signal correcting circuits 44A, 44B, and 44C, the band changing signals SW1, SW2, and SW3 are supplied to the charge pump circuit 441, and subjected to polarity determination by the inverter 445 and then supplied to the charge pump circuit 443.

The charge pump circuits 441 and 443 control the charging and discharging of the capacitor element 442 according to the band changing signal SW1, SW2, or SW3 input to the charge pump circuits 441 and 443.

Specifically, when the band changing signal SW1, SW2, or SW3 is at a high level, the charge pump circuit 441 charges the capacitor element 442 with the minute current from the minute variable current source 45. When the band changing signal SW1, SW2, or SW3 is at a low level, the charge pump circuit 441 discharges the capacitor element 442 with the minute current from the minute variable current source 45.

The minute variable current source 45 can have the configuration of a well known variable current source described in Japanese Patent Laid-Open No. Hei 7-234731, for example. In this case, the minute variable current source

45 supplies the charge pump circuits 441 and 443 with the minute current to charge the capacitor elements 442 and 444 slowly and discharge the capacitor elements 442 and 444 slowly.

Incidentally, in the example of FIG. 7, the minute variable current source 45 can be controlled to a plurality of current values by a current value variable control signal CTL of a plurality of bits supplied from the outside of the IC via a terminal pin. In the example of FIG. 7, the minute variable current source 45 can be controlled to four current values by a two-bit current value variable control signal CTL.

A voltage obtained across the capacitor element 442 is applied to the gate controlling terminal 405.

When the band changing signal SW1, SW2, or SW3 is changed from a low level to a high level to turn the signal switch 42A, 42B, or 42C from an off state to an on state at the time of a band change, the charge pump circuit 441 starts charging the capacitor element 442. At this time, even when the band changing signal SW1, SW2, or SW3 changes stepwise, the capacitor element 442 is charged with the minute current from the minute variable current source 45, so that the voltage across the capacitor element 442 rises gently according to the current value of the minute current.

When the band changing signal SW1, SW2, or SW3 is changed from the high level to the low level to turn the signal switch 42A, 42B, or 42C from the on state to the off state at the time of a band change, the charge pump circuit 441 starts discharging the capacitor element 442. At this time, even when the band changing signal SW1, SW2, or SW3 changes stepwise, the capacitor element 442 is discharged with the minute current from the minute variable current source 45, so that the voltage across the capacitor element 442 falls gently according to the current value of the minute current.

Thus, even when the band changing signal SW1, SW2, or SW3 steeply changes stepwise, the gate controlling potential of the gate controlling terminal 405 changes gently.

On the other hand, the charge pump circuit 443 is supplied with the band changing signal SW1, SW2, or SW3 via the inverter 445. The charge pump circuit 443 therefore performs complementary operation with respect to the charge pump circuit 441. That is, the drain controlling potential of the drain controlling terminal 406 makes complementary changes with respect to the gate controlling potential.

As with the gate controlling potential, the drain controlling potential changes continuously and gently even when the band changing signal SW1, SW2, or SW3 steeply changes stepwise because the charge pump circuit 443 is driven by the minute current from the minute variable current source 45.

As described above, in the third embodiment, changing control signals supplied to the gate controlling terminal 405 and the drain controlling terminal 406 of the signal switches 42A, 42B, and 42C change gently. Hence, also in the third embodiment, as in the second embodiment, a spike-shaped noise as described with reference to FIGS. 15A to 15C is prevented from being superimposed on a signal supplied to another tuner than a tuner that has made a band change, and signal degradation in the other tuner is reduced.

Also in the third embodiment, because the drain controlling terminal 406 is controlled so as to make a complementary potential change with respect to the gate controlling terminal 405, excellent distortion characteristics of the signal switches 42A, 42B, and 42C as analog switches can be obtained.

The charge pump circuits 441 and 443 have a similar configuration. An example of circuit configuration of the charge pump circuits 441 and 443 is shown in FIG. 8.

Figure 8:
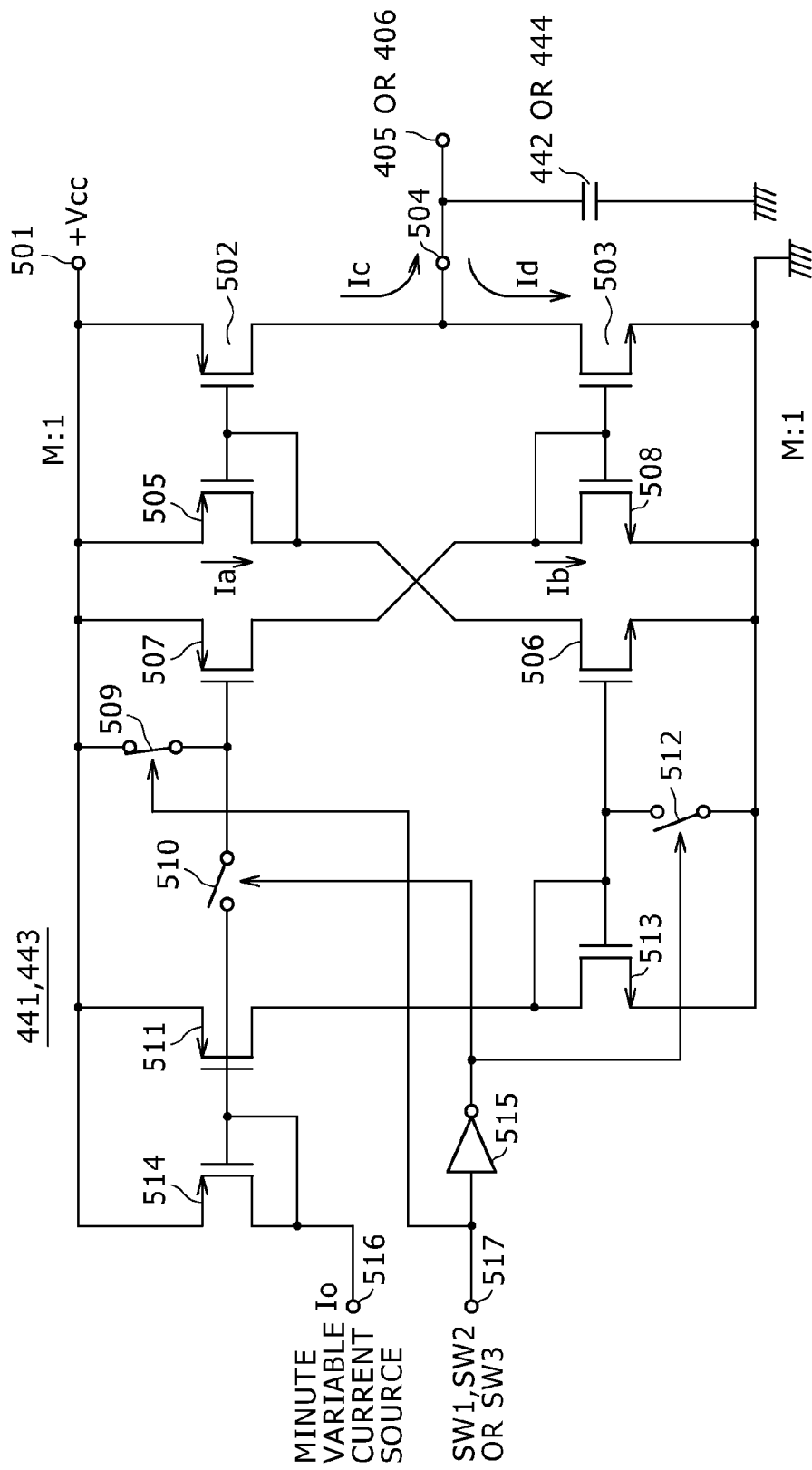
FIG. 8 is a diagram showing a circuit example of principal parts of the example of FIG. 7.

As shown in FIG. 8, a series circuit of the source and drain of a p-type MOS transistor 502 and the drain and source of an n-type MOS transistor 503 is connected between a power supply terminal 501 providing a power supply voltage +Vcc and a grounding terminal.

A point of connection between the drain of the MOS transistor 502 and the drain of the MOS transistor 503 is connected to an output terminal 504. The output terminal 504 is grounded via the capacitor element 442 or 444, and is connected to the gate controlling terminal 405 or the drain controlling terminal 406.

In addition, a series circuit of the source and drain of a p-type MOS transistor 505, which is formed into a diode-connected configuration by connecting the gate and drain of the MOS transistor 505 to each other, and the drain and source of an n-type MOS transistor 506 is connected between the power supply terminal 501 and the grounding terminal. The gate of the MOS transistor 505 and the gate of the MOS transistor 502 are connected to each other, so that a current mirror configuration is formed.

In this example, a ratio of a current Ia flowing through the MOS transistor 505 to a current Ic flowing through the MOS transistor 502 is Ia:Ic=M:1, where M is an integer of one or more.

In addition, a series circuit of the drain and source of a p-type MOS transistor 507 and the source and drain of an n-type MOS transistor 508, which is formed into a diode-connected configuration by connecting the gate and drain of the MOS transistor 508 to each other, is connected between the power supply terminal 501 and the grounding terminal. The gate of the MOS transistor 508 and the gate of the MOS transistor 503 are connected to each other, so that a current mirror configuration is formed.

In this example, a ratio of a current Ib flowing through the MOS transistor 508 to a current Id flowing through the MOS transistor 503 is Ib:Id=M:1.

The gate of the p-type MOS transistor 507 is connected to the power supply terminal 501 via a switch 509, and is connected to the gate of a p-type MOS transistor 511 via a switch 510.

In addition, the gate of the n-type MOS transistor 506 is connected to the grounding terminal via a switch 512, and is connected to the gate of a diode-connected n-type MOS transistor 513.

In addition, a series circuit of the source and drain of the p-type MOS transistor 511 and the drain and source of the n-type MOS transistor 513 is connected between the power supply terminal 501 and the grounding terminal.

Further, the source and drain of a diode-connected p-type MOS transistor 514 are connected between the power supply terminal 501 and a minute current input terminal 516. The minute current input terminal 516 is supplied with a reference minute current Io from the minute variable current source 45.

The gate of the p-type MOS transistor 511 is connected to the gate of the diode-connected p-type MOS transistor 514, so that a current mirror configuration is formed.

In the case of the charge pump circuit 441, a changing signal input terminal 517 is supplied with the band changing signal SW1, SW2, or SW3 of a polarity as it is from the controlling section 20. In the case of the charge pump circuit 443, the band changing signal SW1, SW2, or SW3 from the controlling section 20 is inverted in polarity, and then supplied to the changing signal input terminal 517.

The changing signal from the changing signal input terminal 517 is supplied to the switch 509 with the polarity as it is, and inverted in polarity by an inverter 515 and then supplied to the switch 510 and the switch 512.

The operation of the charge pump circuit having the above configuration will next be described by taking the case of the charge pump circuit 441 as an example.

The reference minute current Io is output from the minute variable current source 45 at all times. Thus, a current corresponding to the minute current Io is also flowing through the MOS transistors 511 and 513 because of the current mirror configuration.

When the band changing signal SW1, SW2, or SW3 is changed from a low level to a high level, as shown in FIG. 8, the switch 509 is turned on, and the switches 510 and 512 are turned off.

Thus, at this time, a corresponding current flows through the system of the MOS transistors 505 and 506 due to the current mirror configuration. Then, the current Ic flows through the MOS transistor 502 forming the current mirror configuration with the MOS transistor 505. The capacitor element 442 or 444 is charged from 0 V by the current Ic.

When the band changing signal SW1, SW2, or SW3 is changed from the high level to the low level, the switch 509 is turned off, and the switches 510 and 512 are turned on, as an opposite state from FIG. 8.

Then, at this time, a corresponding current flows through the system of the MOS transistors 507 and 508 due to the current mirror configuration. Then, the current Id flows through the MOS transistor 503 forming the current mirror configuration with the MOS transistor 508. The capacitor element 442 or 444 is discharged from the power supply voltage by the current Id.

A time taken to complete the charging or discharging of the capacitor element 442 or 444 is determined by the value of the capacitor element 442 or 444 and the current values of the charge pump currents Ic and Id.

In the charge pump circuit in the example of FIG. 8, the current values for the charging or discharging of the capacitor element 442 or 444 are determined by optimally designing the current mirror current ratio M:1 in the output stage. The value of the reference minute current Io is varied by variably controlling the minute variable current source 45 by the current value variable control signal CTL.

In the case of the charge pump circuit 443, the band changing signals SW1, SW2, and SW3 are supplied after being inverted in polarity, and thus operating relation to the high level and the low level of the band changing signals SW1, SW2, and SW3 is opposite.

Figure 9:
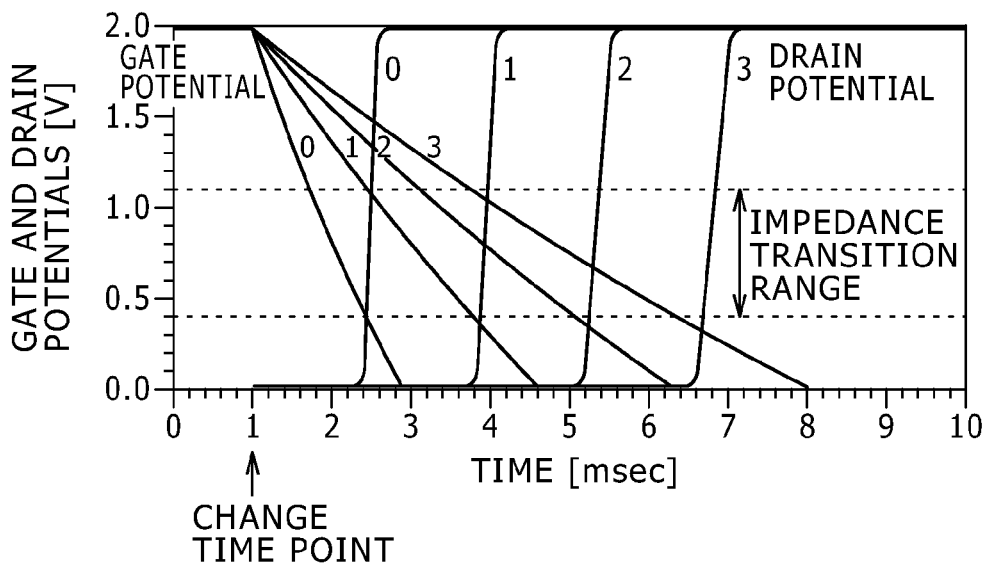
FIG. 9 is a diagram of assistance in explaining characteristics at a time of changing a signal switch in the example of FIG. 7.

FIG. 9 shows changes in potential of the gate and drain of MOS transistors 411 and 412 in the signal switch 42A, 42B, or 42C when the band changing signal SW1, SW2, or SW3 is changed from the high level to the low level. In the example of FIG. 9, the band changing signal SW1, SW2, or SW3 changing from the high level to the low level is given at a time=1 msec.

As shown in FIG. 9, the gate potential gradually decreases from 2 V (power supply voltage) due to the discharge of the capacitor element 442, and falls to 0 V (ground potential) after a few msec. Conversely, the drain potential rises from 0 V (ground potential) to 2 V (power supply voltage).

An impedance transition range in FIG. 9 is meant to correspond to a range in which the on resistance of the MOS transistors 411 and 412 changes. That is, the example of FIG. 9 shows that the impedance transition time of the signal switch 42A, 42B, or 42C is about 1 msec to a few msec.

Incidentally, in FIG. 9, numbers on the right side of the transition curves of respective gate potentials and the transition curves of respective drain potentials indicate the code value of the two-bit current value variable control signal CTL in the minute variable current source 45. Specifically, in this example, when the code value of the current value variable control signal CTL is increased, the value of the reference minute current is decreased, and the charging or discharging time is consequently lengthened.

As shown in FIG. 9, the gate potential changes and the drain potential changes are not symmetric. This is because the gate potential of the MOS transistors 411 and 412 is determined by only the value of the capacitor element 442 and the current value Ic of the charge pump circuit, whereas the drain potential of the MOS transistors 411 and 412 is affected by the gate potential.

Specifically, when the gate potential of the MOS transistors 411 and 412 is high, the on resistance of the MOS transistors 411 and 412 is low. Therefore, a current for charging is not stored in the capacitor element 444, but discharged to the ground side via the MOS transistors. Thus, the potential of the capacitor element 444 does not rise in proportion to time.

Figure 10:
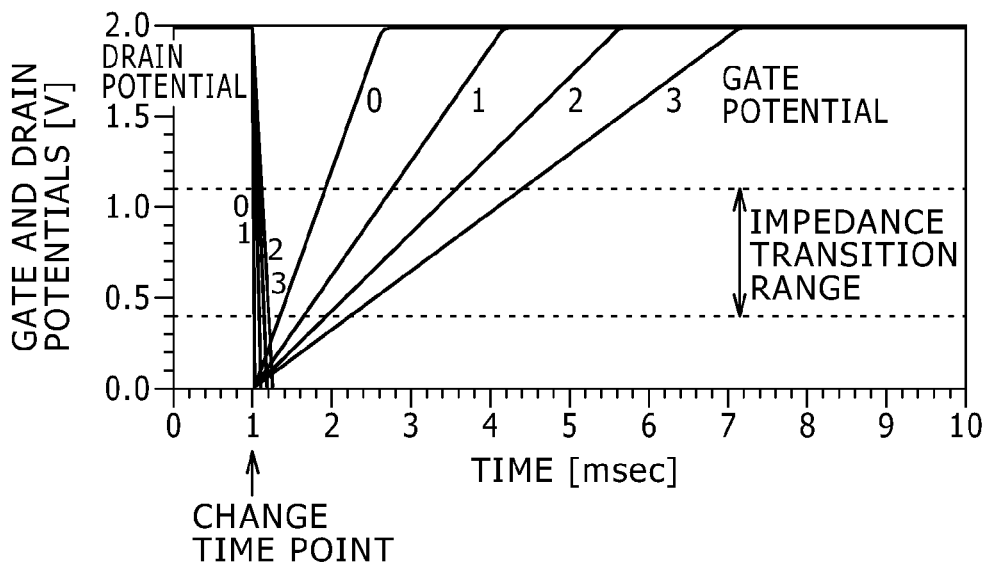
FIG. 10 is a diagram of assistance in explaining characteristics at a time of changing a signal switch in the example of FIG. 7.

FIG. 10, as opposed to FIG. 9, shows changes in potential of the gate and drain of the MOS transistors 411 and 412 in the signal switch 42A, 42B, or 42C when the band changing signal SW1, SW2, or SW3 is changed from the low level to the high level. Also in this case, the band changing signal SW1, SW2, or SW3 changing from the low level to the high level is given at a time=1 msec.

Incidentally, as also described above, in order to control the turning on and off of the signal switches 42A, 42B, and 42C, it suffices to supply the band changing signals SW1, SW2, and SW3 to the gate controlling terminals 405 via the changing signal correcting circuits 43A, 43B, and 43C.

However, when the drain controlling terminals 406 are controlled so as to make a complementary potential change with respect to the gate controlling terminals 405 as in the present embodiment, excellent distortion characteristics of the signal switches 42A, 42B, and 42C as analog switches can be obtained.

Figure 11A:
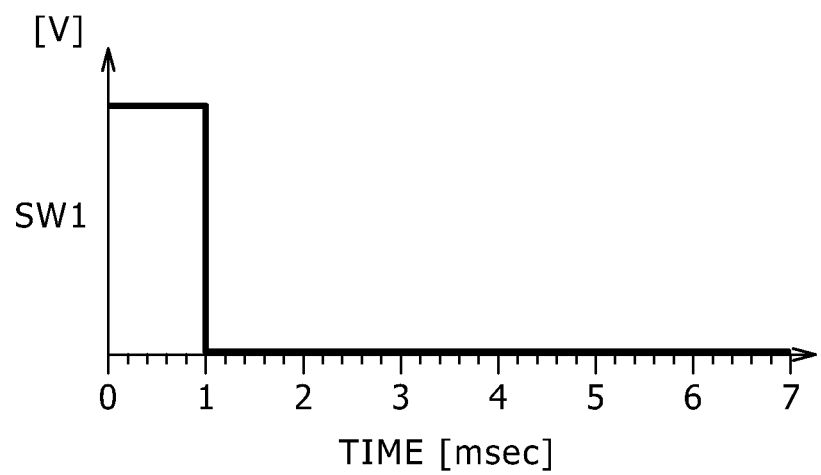
FIGS. 11A and 11B are diagrams of assistance in explaining effects of embodiments of the signal processing device according to the present invention.
Figure 11B:
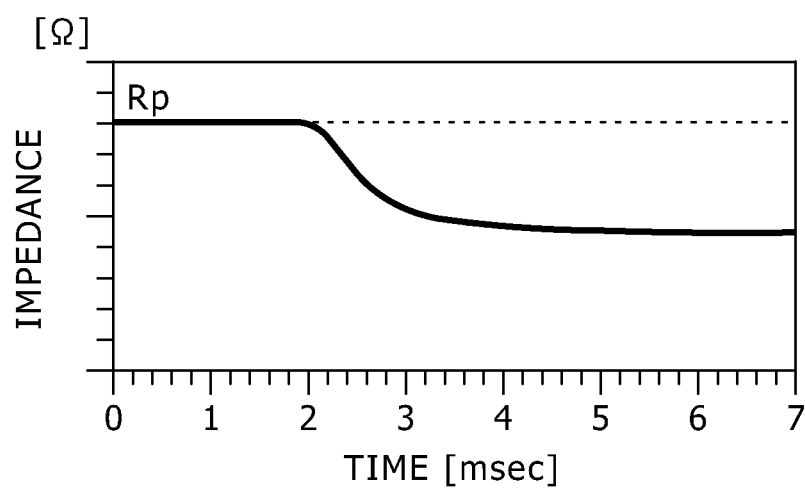

FIGS. 11A and 11B show conditions of transition of input impedance in the front-end circuit of a tuner when the band changing signal SW1 supplied to the signal switch 42A changes from the high level to the low level, for example. After the band changing signal SW1 changes from the high level to the low level at a time=1 msec, the impedance makes a gentle (smooth) transition rather than a stepwise transition, and has a transition time of about 2 msec.

Figure 12A:
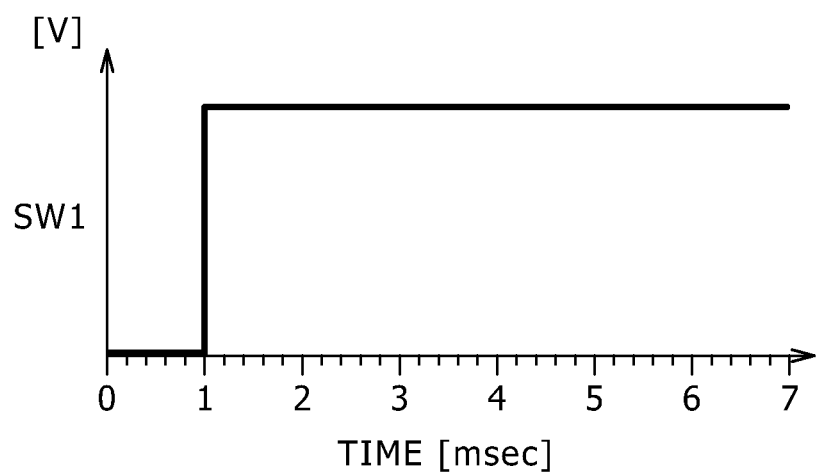
FIGS. 12A and 12B are diagrams of assistance in explaining effects of embodiments of the signal processing device according to the present invention.
Figure 12B:
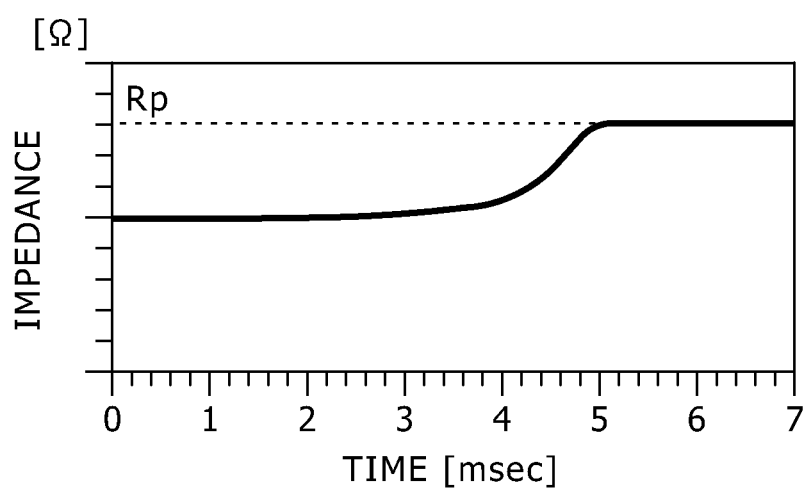

FIGS. 12A and 12B show conditions of transition of input impedance in the front-end circuit of a tuner when the band changing signal SW1 supplied to the signal switch 42A changes from the low level to the high level, for example. Also in this case, after the band changing signal SW1 changes from the low level to the high level at a time=1 msec, the impedance makes a gentle (smooth) transition rather than a stepwise transition, and has a transition time of about 4 msec.

Effect of Embodiment

As described above, according to the above-described embodiments, as shown in FIGS. 11A to 12B, the input impedance that makes a transition when a band change is made in the tuner 231 or 232 have continuous and gentle transition characteristics rather than a stepwise steep transition.

Thus, even when a good isolation is not provided between the output terminals of the splitter 22, the tuner can perform a band changing operation without degrading the received signal of another tuner in operation.

Other Embodiments and Examples of Modification

Changing signal correcting circuits for suppressing the band changing signals SW1, SW2, and SW3 supplied to the signal switches 42A, 42B, and 42C from stepwise signals to signals changing continuously and gently are not limited to the foregoing embodiments.

For example, the gate controlling potential supplied to the gate controlling terminal 405 and the drain controlling potential supplied to the drain controlling terminal 406 may be converted into a PWM (Pulse Width Modulation) signal, and the pulse width of the PWM signal may be changed continuously and gently at the time of a switch change.

Incidentally, while the field effect transistors in the above description are of a MOS type, it is needless to say that the field effect transistors are not limited to only the MOS type.

In the foregoing embodiments, a tuner as a signal processing section has three signal switches. However, the number of signal switches may be one or two, or four or more, of course. In the case of one signal switch, selection is made as to whether or not the signal processing section is connected to an output terminal of a signal distributing section.

In addition, in the foregoing embodiments, description has been made of only a case where all signal processing sections connected to a plurality of output sides of a signal distributing section are provided with signal switches. However, not all signal processing sections need to be provided with signal switches. The present invention can be applied when a signal switch is provided to at least one of signal processing sections connected to a plurality of output sides of a signal distributing section.

The foregoing embodiments are examples in which the present invention is applied to a device for receiving a television broadcast signal. It is needless to say, however, that the present invention is not limited to cases of receiving television broadcasts. The present invention is applicable to all cases where a received signal is supplied to a plurality of signal processing sections via a signal distributing section and the signal processing sections have one or a plurality of signal switches.

It should be understood by those skilled in the art that various modifications, combinations, sub-combinations and alterations may occur depending on design requirements and other factor in so far as they are within the scope of the appended claims or the equivalents thereof.

What is claimed is:

1. A signal processing device, comprising:
   a receiving element configured to receive an input signal including a plurality of signal bands;
   at least one signal processing section configured to receive an output signal including the plurality of signal bands and to selectively provide a signal from among the plurality of signal bands in response to a control signal having a transition between a first state and a second state; and
   a correction circuit disposed between the receiving element and the at least one signal processing section and configured to receive the control signal and provide a corrected control signal and the output signal for the at least one signal processing section, the corrected control signal having a gradual transition between the first state and the second state as compared to the transition between the first state and the second state in the control signal.

2. The signal processing device according to claim 1, wherein
the at least one signal processing section is a plurality of signal processing sections; and
providing the corrected control signal for a first signal processing section of the plurality of signal processing sections reduces a signal degradation occurring in a second signal processing section of the plurality of signal processing sections in response to the transition.

3. The signal processing device according to claim 1, wherein
the at least one signal processing section is a plurality of signal processing sections; and
providing the corrected control signal produces a reduced rate of impedance in a first signal processing section of the plurality of signal processing sections to prevent a signal degradation occurring in a second signal processing section of the plurality of signal processing sections in response to the transition.

4. The signal processing device according to claim 1, wherein the correction circuit comprises:
a time constant circuit having an input that receives the control signal and an output that provides the corrected control signal; and
a variable resistive element connected to the output of the time constant circuit.

5. The signal processing device according to claim 4, wherein the variable resistive element comprises a transistor, a gate of the transistor receiving from the output of the time constant circuit the corrected control signal.

6. The signal processing device according to claim 1, wherein:
the correction circuit comprises a time constant circuit having an input node that receives the control signal and an output node that provides the corrected control signal,
wherein the signal processing section comprises a signal switch for selecting one of the plurality of signal bands, the signal switch receiving the corrected control signal from the output node of the time constant circuit.

7. The signal processing device according to claim 6, wherein:
the signal switch includes a gate controlling terminal and a drain controlling terminal, the gate controlling terminal receiving the corrected control signal and the drain controlling terminal receiving a complementary corrected control signal.

8. The signal processing device according to claim 7, wherein the correction circuit comprises an inverter and another time constant circuit that cooperate to produce the complementary corrected control signal.

9. The signal processing device according to claim 1, wherein:
the correction circuit comprises a charge pump circuit and a capacitive element, the charge pump circuit receiving the control signal, and the charge pump circuit and the capacitive element cooperating to produce the corrected control signal at an output node of the correction circuit; and
wherein the signal processing section comprises a signal switch for selecting one of the plurality of signal bands, the signal switch receiving the corrected control signal from the output node of the correction circuit.

10. The signal processing device according to claim 1, further comprising:
a controller circuit, which outputs the control signal to the correction circuit.

11. A signal processing method, comprising:
receiving, by a receiving element, an input signal including a plurality of signal bands;
receiving, by at least one signal processing section, an output signal including the plurality of signal bands;
selectively providing, by the at least one signal processing section, a signal from among the plurality of signal bands in response to a control signal having a transition between a first state and a second state; and
receiving the control signal, by a correction circuit disposed between the receiving element and the at least one signal processing section, and providing a corrected control signal and the output signal for the at least one signal processing section, the corrected control signal having a gradual transition between the first state and the second state as compared to the transition between the first state and the second state in the control signal.

12. The signal processing method according to claim 11, wherein
the at least one signal processing section is a plurality of signal processing sections; and
providing the corrected control signal for a first signal processing section of the plurality of signal processing sections reduces a signal degradation occurring in a second signal processing section of the plurality of signal processing sections in response to the transition.

13. The signal processing method according to claim 11, wherein
the at least one signal processing section is a plurality of signal processing sections; and
providing the corrected control signal produces a reduced rate of impedance in a first signal processing section of the plurality of signal processing sections to prevent a signal degradation occurring in a second signal processing section of the plurality of signal processing sections in response to the transition.

14. The signal processing method according to claim 11, wherein the receiving by the correction circuit comprises:
receiving, by an input of a time constant circuit, the control signal; and
providing, by an output of the time constant circuit, the corrected control signal, wherein
a variable resistive element is connected to the output of the time constant circuit.

15. The signal processing method according to claim 14, wherein the variable resistive element comprises a transistor, the method further comprising receiving at a gate of the transistor, from the output of the time constant circuit, the corrected control signal.

16. The signal processing method according to claim 11, further comprising:
receiving, at an input node of a time constant circuit of the correction circuit, the control signal; and
providing, by an output node of the time constant circuit, the corrected control signal,
wherein the signal processing section comprises a signal switch for selecting one of the plurality of signal bands, the signal switch receiving the corrected control signal from the output node of the time constant circuit.

17. The signal processing method according to claim 16, wherein:

the signal switch includes a gate controlling terminal and a drain controlling terminal, the method further comprising receiving, at the gate controlling terminal, the corrected control signal, and receiving, at the drain controlling terminal, a complementary corrected control signal.

18. The signal processing method according to claim 17, further comprising cooperatively producing, by an inverter and another time constant circuit included in the correction circuit, the complementary corrected control signal.

19. The signal processing method according to claim 11, further comprising:
- receiving, by a charge pump circuit of the correction circuit, the control signal, and cooperatively producing, by the charge pump circuit and a capacitive element of the correction circuit, the corrected control signal at an output node of the correction circuit; and
- wherein the signal processing section comprises a signal switch for selecting one of the plurality of signal bands, the signal switch receiving the corrected control signal from the output node of the correction circuit.

20. The signal processing method according to claim 11, further comprising:
- outputting, by a controller circuit, the control signal to the correction circuit.

* * * * *